(12) United States Patent
Tatsumi

(10) Patent No.: US 7,807,518 B2
(45) Date of Patent: Oct. 5, 2010

(54) SEMICONDUCTOR MEMORY DEVICE AND MANUFACTURING METHOD THEREOF

(75) Inventor: Tomohiko Tatsumi, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 45 days.

(21) Appl. No.: 12/081,633

(22) Filed: Apr. 18, 2008

(65) Prior Publication Data

US 2008/0296647 A1   Dec. 4, 2008

(30) Foreign Application Priority Data

May 30, 2007   (JP)   .............................. 2007-144198

(51) Int. Cl.
 *H01L 21/84*   (2006.01)
 *H01L 29/94*   (2006.01)
(52) U.S. Cl. .................. 438/155; 438/239; 438/257; 438/264; 438/297; 257/298; 257/300; 257/E27.103; 257/E27.112; 257/E29.3; 257/E21.422; 257/E21.68; 257/E21.694; 365/185.1; 365/184
(58) Field of Classification Search ......... 257/296–313, 257/314–326, 347–354, E21.179–E21.182, 257/E21.209–E21.21, E21.422, E21.423, 257/E21.679–E21.694, E27.103, E27.112, 257/E21.68, E29.3; 438/151–278, 280, 294–298, 438/288, 576–579, 311, 386–395, 405, 479–481; 365/185.1, 185.01, 184
See application file for complete search history.

(56) References Cited

U.S. PATENT DOCUMENTS

| | | | |
|---|---|---|---|
| 6,611,458 B2 | 8/2003 | Ishibashi et al. | |
| 2007/0187755 A1* | 8/2007 | Moore | 257/335 |
| 2007/0228467 A1* | 10/2007 | Kurachi | 257/347 |
| 2009/0065838 A1* | 3/2009 | Nagao | 257/298 |

FOREIGN PATENT DOCUMENTS

JP   2001-229690   8/2001

\* cited by examiner

*Primary Examiner*—Matthew C Landau
*Assistant Examiner*—Aaron Staniszewski
(74) *Attorney, Agent, or Firm*—Rabin & Berdo, PC

(57) ABSTRACT

The present invention provides a semiconductor memory device having a capacitor electrode of a MOS capacitor formed in polygon and slanting faces enlarged toward an insulating film are provided therearound. A floating gate electrode is provided which extends from over a channel region of a MOSEFT to over corners of ends on the MOSFET side, of the capacitor electrode and which is opposite to the channel region and the capacitor electrode with a gate insulating film interposed therebetween.

7 Claims, 6 Drawing Sheets

SEMICONDUCTOR MEMORY DEVICE AND MANUFACTURING METHOD THEREOF

BACKGROUND OF THE INVENTION

The present invention relates to a semiconductor device having an electrically reprogrammable non-volatile memory, and a manufacturing method thereof.

A conventional semiconductor memory device is configured in such a manner that two transistors respectively formed in a P well layer and an N well layer formed in a bulk substrate with a flash memory formed therein are connected in series by one floating gate electrode. Upon an erase operation, a control gate electrode and a drain layer are grounded and a voltage of 7V is applied to a source layer to pull out electrons from the floating gate electrode by a tunnel current, thereby reducing the threshold voltage of the flash memory. Upon a write operation, the drain layer is grounded and a voltage of 5V is applied to the control gate electrode and the source layer to inject hot electrons into the floating gate electrode, thereby increasing the threshold voltage of the flash memory, whereby data stored according to the magnitude of the threshold voltage is read (refer to, for example, a patent document 1 (Japanese Unexamined Patent Publication No. 2001-229690 (paragraph 0011 in fifth page—paragraph 0021 in sixth page, and FIG. 1)).

Since, however, the flash memory is formed in the bulk substrate in the above-described related art, a source-to-drain breakdown voltage is high and electric charges can be injected into the floating gate electrode through a gate oxide film. However, a fully-depleted SOI structure type semiconductor memory device in which an SOI (Silicon On Insulator) layer made up of thin-film silicon is stacked on an embedded oxide film, is accompanied by problems that it is difficult to sufficiently ensure a source-to-drain breakdown voltage of a MOSFET (MOS Field Effect Transistor) formed in the SOI layer, and electric charges cannot be injected into a floating gate electrode through a gate oxide film, thus encountering difficulties in forming an electrically reprogrammable non-volatile memory in the semiconductor memory device of SOI structure.

Therefore, when the time required to inject the electric charges into the floating gate electrode is long, the time required to inject the electric charges at product inspections before shipment also becomes long, thereby leading to a rise in manufacturing cost.

SUMMARY OF THE INVENTION

The present invention has been made in view of the foregoing problems. It is therefore an object of the present invention to provide means for injecting electric charges into a floating gate electrode of a semiconductor memory device of SOI structure in a short period of time.

According to one aspect of the present invention, for attaining the above object, there is provided a semiconductor memory device comprising:

a semiconductor substrate formed of a support substrate, an insulating film formed over the support substrate and a semiconductor layer formed over the insulating film; a MOSFET having a source layer and a drain layer both formed in the semiconductor layer of a transistor forming area set to the semiconductor substrate, and a channel region provided between the source and drain layers; a MOS capacitor having a capacitor electrode which is formed in the semiconductor layer of a capacitor forming area set to the semiconductor substrate and in which an impurity of the same type as the source layer is diffused; and a device isolation layer which insulates and separates between the semiconductor layer formed with the MOSFET and the semiconductor layer formed with the MOS capacitor, wherein the capacitor electrode of the MOS capacitor is formed in polygon and slanting faces enlarged toward the insulating film are provided therearound, and wherein a floating gate electrode is provided which extends from over a channel region of the MOSEFT to over corners of ends on the MOSFET side, of the capacitor electrode and which is opposite to the channel region and the capacitor electrode with a gate insulating film interposed therebetween.

Thus, the present invention obtains advantageous effects in that upon an erase operation of a memory element that injects electric charges into a floating gate electrode, the injection of electrons into the floating gate electrode can easily be done using the concentration of an electric field by a pyramidal tip or leading end formed at the corner below the floating gate electrode, of a capacitor electrode, regardless of a source-to-drain breakdown voltage, and even in a semiconductor memory device of SOI structure low in the source-to-drain breakdown voltage, the electric charges can be injected into the corresponding floating gate electrode in a short period of time.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a semiconductor memory device according to the present invention and a manufacturing method thereof will hereinafter be described with reference to the accompanying drawings.

First Preferred Embodiment

Figure 1:
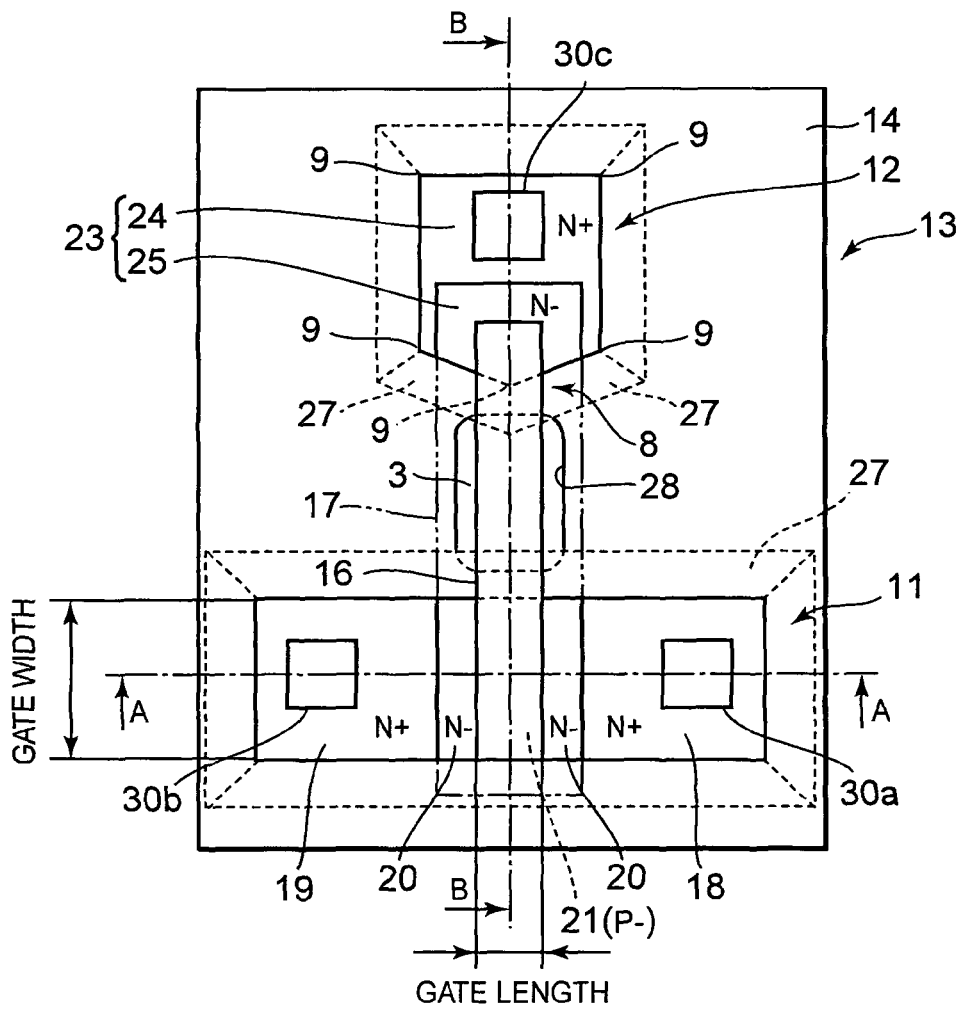
FIG. 1 is an explanatory diagram showing an upper surface of a memory element according to a first embodiment.
Figure 2:
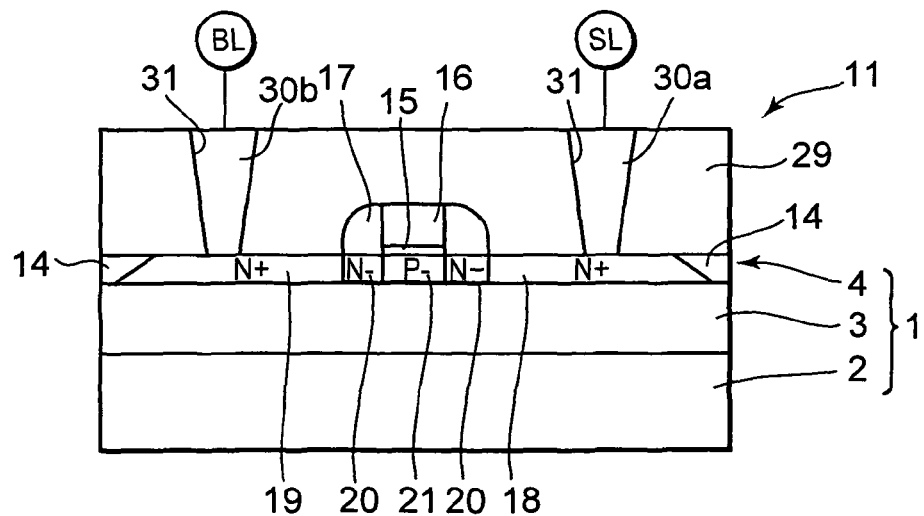
FIG. 2 is an explanatory diagram illustrating a section taken along sectional line A-A of FIG. 1.
Figure 3:
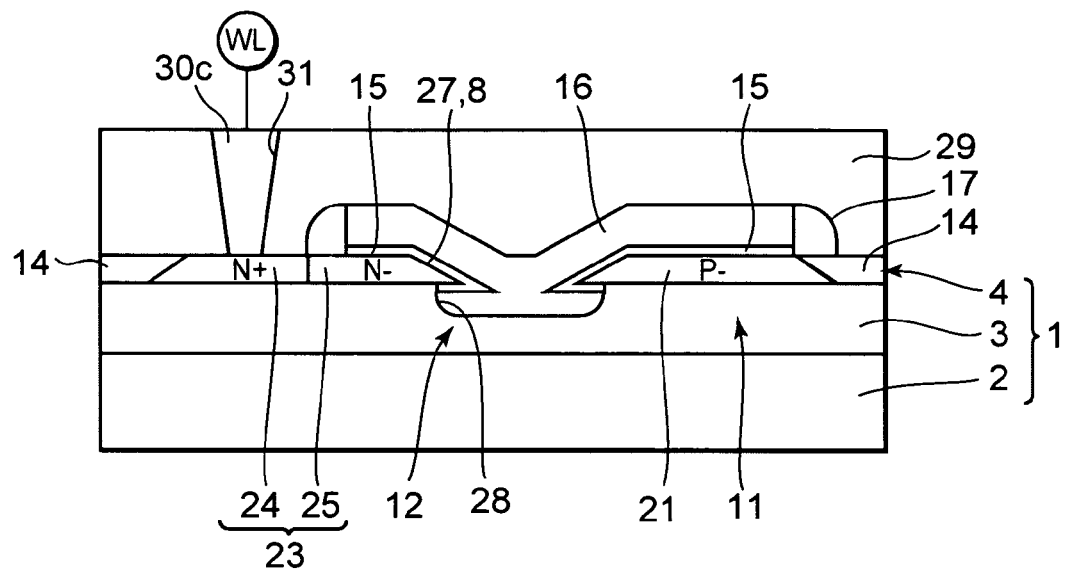
FIG. 3 is an explanatory diagram showing a section taken along sectional line B-B of FIG. 1.
Figure 4:
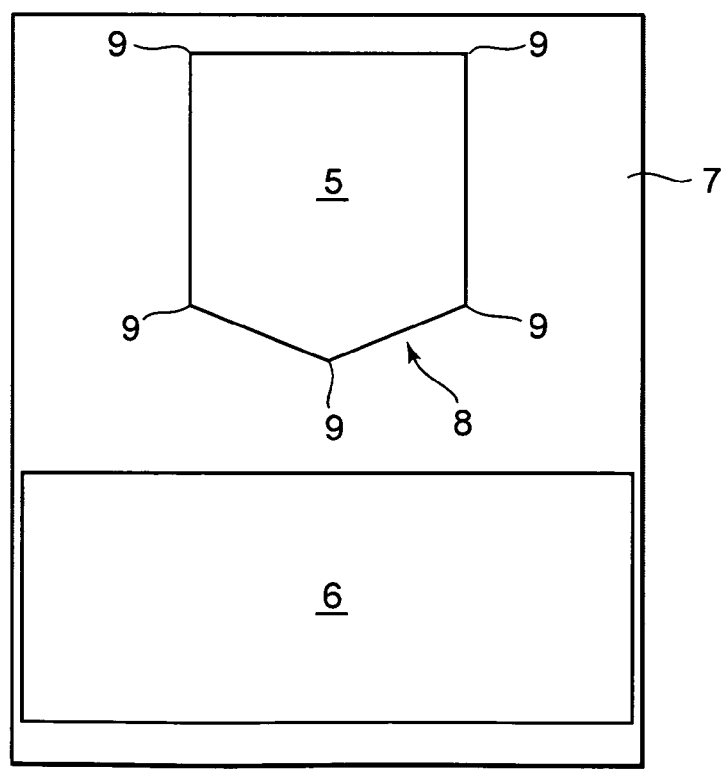
FIG. 4 is an explanatory diagram depicting the state of setting of a region on an SOI layer employed in the first embodiment.
Figure 5:
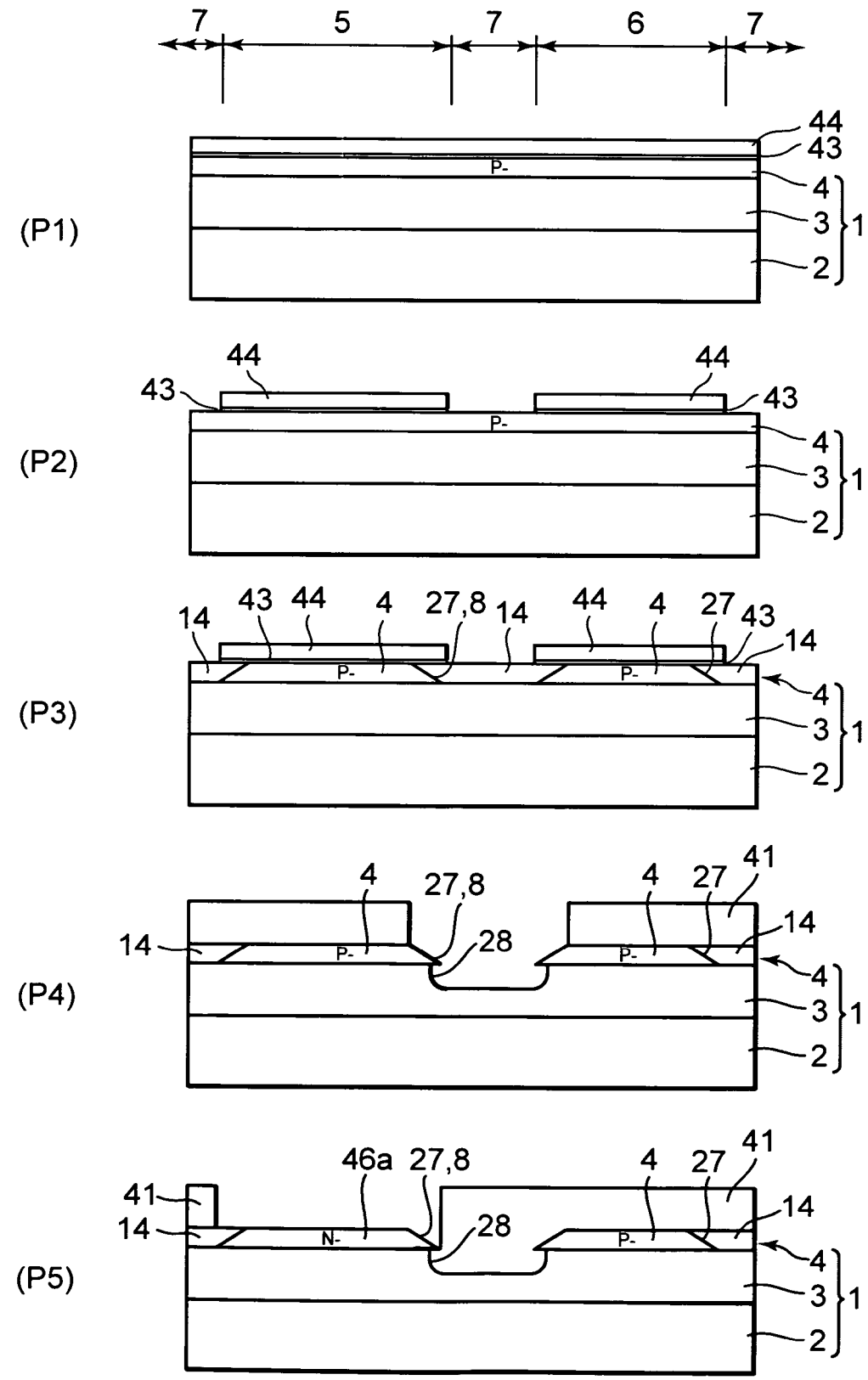
FIG. 5 is an explanatory diagram illustrating a method for manufacturing a semiconductor memory device according to the first embodiment.
Figure 6:
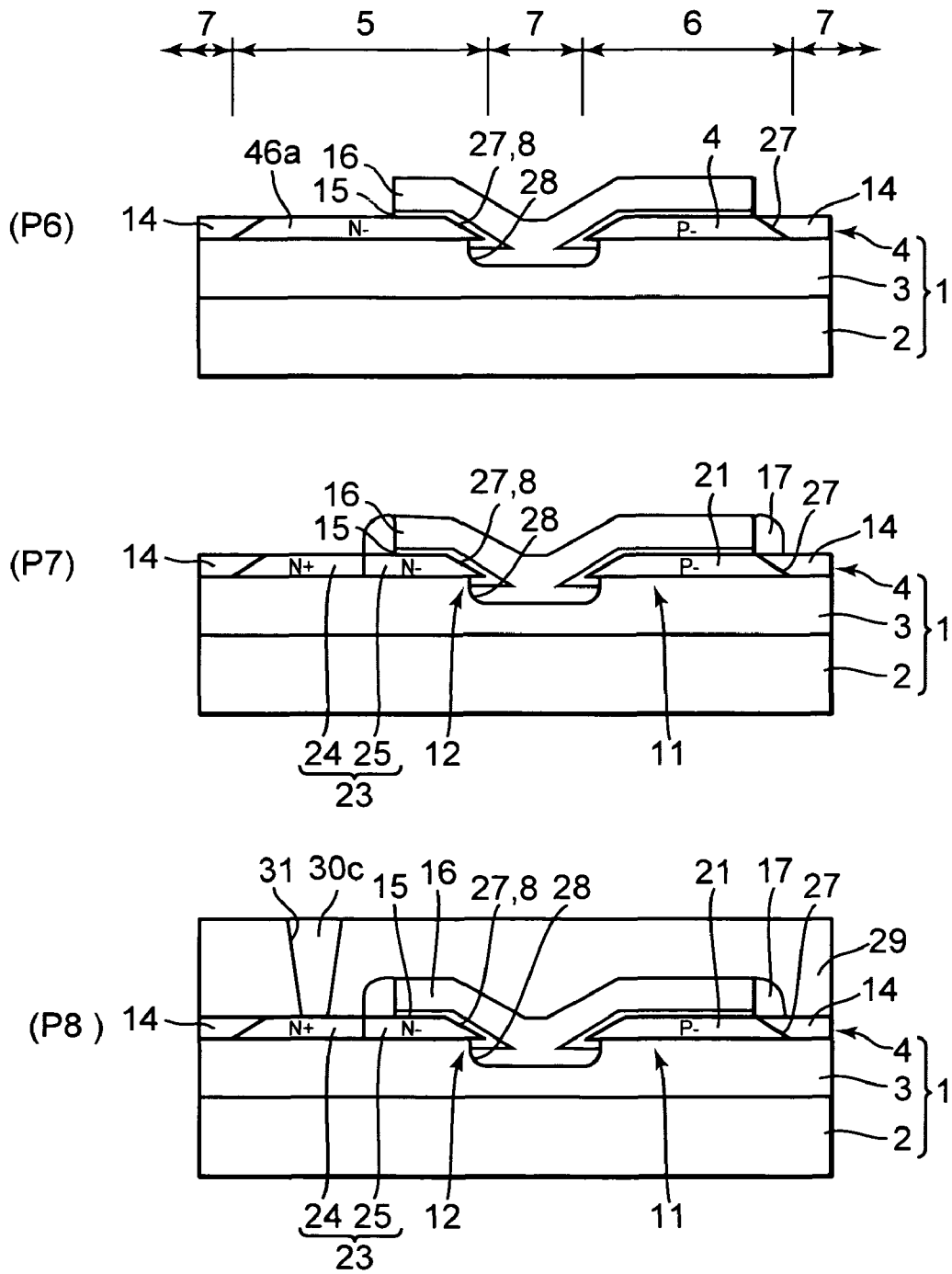
FIG. 6 is an explanatory diagram showing the method for manufacturing the semiconductor memory device according to the first embodiment.
Figure 7:
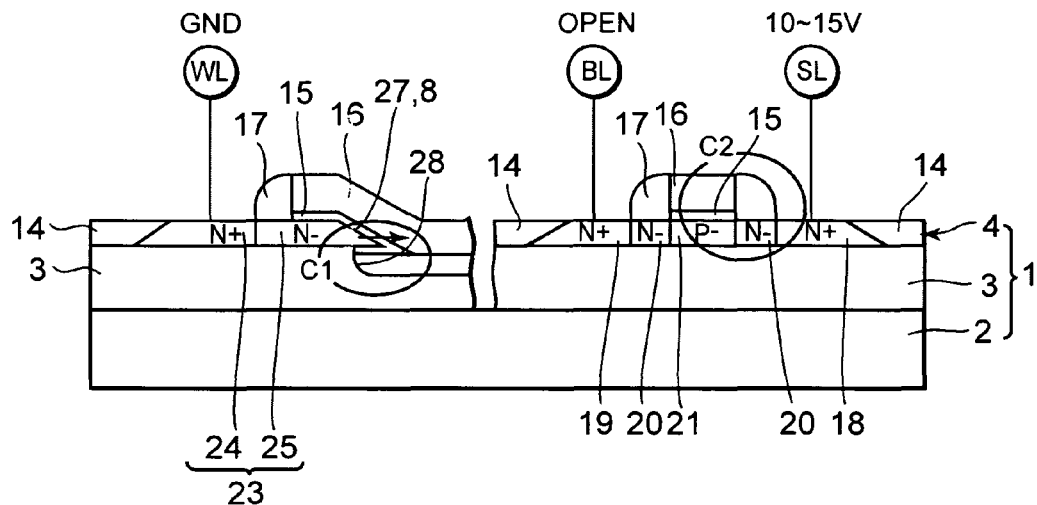
FIG. 7 is an explanatory diagram illustrating an erase operation of the memory element according to the first embodiment.

FIG. 1 is an explanatory diagram showing an upper surface of a memory element or device according to a first embodiment, FIG. 2 is an explanatory diagram illustrating a section taken along sectional line A-A of FIG. 1, FIG. 3 is an explanatory diagram showing a section taken along sectional line B-B of FIG. 1, FIG. 4 is an explanatory diagram depicting the state of setting of a region on an SOI layer employed in the first embodiment, FIGS. 5 and 6 are explanatory diagrams illustrating a method for manufacturing a semiconductor memory device according to the first embodiment, and FIG. 7 is an explanatory diagram illustrating an erase operation of the memory element according to the first embodiment.

Incidentally, FIG. 1 is drawn in a state in which an interlayer insulating film and sidewalls are omitted.

Therefore, when the time required to inject the electric charges into the floating gate electrode is long, the time required to inject the electric charges at product inspections before shipment also becomes long, thereby leading to a rise in manufacturing cost.

In FIGS. 1, 2 and 3, reference numeral 1 indicates a semiconductor substrate, which is a substrate of SOI structure formed by a support substrate 2 made up of silicon (Si), an embedded oxide film 3 used as an insulating film comprised of silicon oxide ($SiO_2$) of about 1500Å-thick formed on the support substrate 2, and an SOI layer 4 used as a semiconductor layer comprised of monocrystalline silicon of an about 500 Å-thick formed on the embedded oxide film 3.

As shown in FIG. 4, a capacitor forming area 5 for forming a MOS (Metal Oxide Semiconductor) capacitor 12 (to be described later), a transistor forming area 6 for forming a MOSFET, and a device isolation area 7 for forming a device or element isolation layer 14 (to be described later) which surrounds the peripheries of the capacitor forming area 5 and the transistor forming area 6 and insulates and separates between the two adjacent layers from each other, are set onto the SOI layer 4 employed in the present embodiment.

The capacitor forming area 5 of the present embodiment is a polygon having five sharp edges or corners 9, and is provided with a mountain portion 8 that protrudes toward the transistor forming area 6, i.e., a pentagon.

Incidentally, the capacitor forming area 5 and the transistor forming area 6 shown in FIG. 4 are respectively obtained by adding areas for forming slanting faces 27 (to be described later) to their peripheries in association with the form of the upper surface of the SOI layer 4 shown in FIG. 1.

An nMOS element 11 shown in FIG. 2 corresponding to a kind of MOSFET is formed in the transistor forming area 6 of the present embodiment. The MOS capacitor 12 shown in FIG. 3 is formed in the capacitor forming area 5. The nMOS element 11 formed in the transistor forming area 6 and the MOS capacitor 12 formed in the capacitor forming area 5 are combined in series to form one memory or device 13 illustrated in FIG. 1, which functions as an electrically reprogrammable one-bit non-volatile memory.

Reference numeral 14 indicates a device isolation layer, which is an insulating layer that is provided in the SOI layer 4 of the device isolation area 7 and reaches the embedded oxide film 3 formed of an insulating material such as silicon oxide. The device isolation layer 14 has the function of electrically isolating and separating between the adjoining capacitor forming area 5 and transistor forming area 6 of the SOI layer 4.

Reference numeral 15 indicates a gate insulating film that is an insulating film of an about 50 to 150 Å-thick made up of the insulating material such as silicon oxide, which is used commonly by the nMOS element 11 and the MOS capacitor 12 formed on the SOI layer 4 as shown in FIGS. 2 and 3.

Reference numeral 16 indicates a floating gate electrode that is an electrode comprising polysilicon or the like which is disposed opposite to the SOI layer 4 of the capacitor forming area 5 and the transistor forming area 6 with the gate insulating film 15 interposed therebetween. As shown in FIG. 1, the floating gate electrode 16 is formed so as to extend from over a channel region 21 (to be described later) of the nMOS element 11, which divides the transistor forming area 6 into two at its central portion, to over the corner 9 of the top of the mountain portion 8 on the transistor forming area 6 side lying on the capacitor forming area 5. The floating gate electrode 16 functions as a gate electrode that the nMOS element 11 and the MOS capacitor 12 use in common.

Sidewalls 17 made up of the insulating material such as silicon oxide or the like are formed on the side faces of the floating gate electrode 16. The floating gate electrode 16 is brought to a floating state of being electrically insulated from outside by the gate oxide film 15 and the sidewalls 17 or the like.

A source layer 18 (N+) and a drain layer 19 (N+) in which a relatively high-concentration N-type impurity such as arsenic (As) is diffused (over $1 \times 10^{18}$ ions/$cm^3$, for example), are formed on both sides of the floating gate electrode 16 of the SOI layer 4 in the transistor forming area 6. LDD (Lightly Doped Drain) portions 20 (N−) of a source layer 18 and a drain layer 19 with a relatively low-concentration N-type impurity diffused therein are formed below the sidewalls 17 on the floating gate electrode 16 side at the source layer 18 and the drain layer 19. A region (P−) of the SOI layer 4 with a relatively low-concentration P-type impurity such as boron (B) diffused therein, which is provided below the floating gate electrode 16 interposed between these LDD portions 20, functions as the channel region 21 of the nMOS element 11.

Reference numeral 23 indicates a capacitor electrode, which comprises an N+ diffusion layer 24 formed by diffusing an impurity (N type in the present embodiment) of the same type as the source layer 18 into the SOI layer 4 of the capacitor forming area 5 in a relatively high concentration (over $1 \times 10^{18}$ ions/$cm^3$, for example), and an N− diffusion layer 25 formed by diffusing an N-type impurity into the nMOS element 11 side in a relatively low concentration.

The slanting faces 27 enlarged toward the embedded oxide film 3 are formed around the capacitor electrode 23. An area for the corner 9 (corner 9 indicated by a broken line in FIG. 1) of the top of the mountain portion 8 including the slanting faces 27 on the nMOS element 11 side is disposed opposite to the floating gate electrode 16 via the gate insulating film 15 interposed therebetween.

A tip or leading portion is formed in the area for the corner 9 opposite to the floating gate electrode 16 in a pointed state in pyramid form by the top of the mountain portion 8 and the slanting faces 27 lying on its side face side. This pyramidal tip is opposite to the floating gate electrode 16 via the gate insulating film 15. Therefore, the concentration of an electric field becomes easy to occur in the pyramidal tip upon an erase operation of the memory element 13 to be described later. Thus, the pyramidal tip has the function of promoting the injection of charges into the floating gate electrode 16.

Reference numeral 28 indicates a capacitor trench or groove, which is a groove whose bottom face is formed within the embedded oxide film 3 by digging a slanting face 27 constituting a pyramidal tip of the capacitor electrode 23 formed below the floating gate electrode gate 16 and the device isolation layer 14 lying in an area adjacent to the slanting face 27 up to the embedded oxide film 3 and further digging the embedded oxide film 3 deeper than the thickness of the gate insulating film 15. The length of the groove in a gate length direction is formed longer than the gate length of the floating gate electrode 16 shown in FIG. 1.

As shown in FIG. 3, the capacitor groove 28 of the present embodiment is formed by digging the device isolation layer 14 lying below the floating gate electrodes 16 located between the N− diffusion layer 25 of the capacitor electrode 23 and the channel region 21.

Reference numeral 29 indicates an interlayer insulating film that is of an insulating film comprised of an insulating material such as silicon oxide, which covers the nMOS element 11 and the MOS capacitor 12 formed on the SOI layer 4.

Reference numerals 30a through 30c indicate contact plugs respectively, which are plugs formed by respectively embedding a conductive material such as tungsten (W) into contact holes 31 made open through the interlayer insulating film 29 as through holes that extend to over the source layer 18 and drain layer 19 of the nMOS element 11 and the N+ diffusion layer 24 of the capacitor electrode 23 of the MOS capacitor 12.

As shown in FIG. 2, the contact plug 30a connected to the source layer 18 of the nMOS element 11 is electrically connected to an unillustrated source line (SL) of the semiconductor memory device, which is formed of a wiring material relatively excellent in conductivity, such as aluminum (Al), copper (Cu) or the like, the contact plug 30b connected to the drain layer 19 of the nMOS element 11 is electrically connected to an unillustrated bit line (BL), and the contact plug 30c connected to the capacitor electrode 23 of the MOS capacitor 12 is electrically connected to an unillustrated word line (WL) as shown in FIG. 3, respectively.

An electrostatic capacitance C1 (called electrostatic capacitance C1 of MOS capacitor 12 and refer to FIG. 7) between the capacitor electrode 23 of the MOS capacitor 12 and the floating gate electrode 16 both employed in the present embodiment, and an electrostatic capacitance C2 (called electrostatic capacitance C2 on the source layer 18 side and refer to FIG. 7) between the source layer 18 and the floating gate electrode 16 of the nMOS element 11 are respectively set to take C1<C2 by adjusting a capacitor area (called opposite area between the capacitor electrode 23 and the floating gate electrode 16), a MOSFET area (called opposite area between the source layer 18 and the floating gate electrode 16) or a gate width shown in FIG. 1.

In FIGS. 5 and 6, reference numeral 41 indicates a resist mask, which is a mask member formed by performing exposure and development processing on a positive or negative resist applied onto the semiconductor substrate 1 by photolithography. The resist mask 41 functions as a mask used for etching and ion implantation in the present embodiment.

Each of the slanting faces 27 of the capacitor electrode 23 can be formed using a birds beak having an approximately triangular sectional shape, which is formed by, when an SOI layer is oxidized with a silicon nitride film 44 used as an oxidation-resistant film located on a pad oxide film 43 (refer to FIG. 5 (P3)) as a mask by a LOCOS (Local Oxidation of Silicon) method thereby to form a device isolation layer 14, intruding the tip or leading end of the device isolation layer 14 into a boundary portion between the silicon nitride film 44 and the SOI layer 4 in the capacitor forming area 5.

A method for manufacturing the semiconductor memory device of the present embodiment will be explained below in accordance with processes indicated by P in FIGS. 5 and 6.

Incidentally, FIGS. 5 and 6 are shown in section similar to the section shown in FIG. 3.

At P1 (FIG. 5), a semiconductor substrate 1 in which a capacitor forming area 5, a transistor forming area 6 and a device isolation area 7 that surrounds their peripheries are set to an SOI layer 4 of the semiconductor substrate 1 in which the SOI layer 4 with a relatively low-concentration P-type impurity (P−) diffused therein is laminated or stacked on a support substrate 2 via an embedded oxide film 3 interposed therebetween, is prepared. A pad oxide film 43 having a thin thickness is formed on the SOI layer 4 by a thermal oxidation method. A silicon nitride film 44 having a relatively thick thickness is formed on the pad oxide film 43 by a CVD (Chemical Vapor Deposition) method.

At P2 (FIG. 5), a resist mask (not shown) which surrounds the capacitor forming area 5 and the transistor forming area 6 and exposes the silicon nitride film 44 of the device isolation area 7, is formed on the silicon nitride film 44 by photolithography. With it as a mask, the silicon nitride film 44 and the pad oxide film 43 are etched by anisotropic etching to expose the SOI layer 4 and remove the resist mask.

At P3 (FIG. 5), the SOI layer 4 is oxidized by the LOCOS method with the silicon nitride film 44 as a mask to form each device isolation layer 14 reaching the embedded oxide film 3 between the transistor forming area 6 and the capacitor forming area 5.

At this time, the silicon nitride film side of the SOI layer 4 is oxidized to form a birds beak, and slanting faces 27 enlarged toward the embedded oxide film 3 are formed around the SOI layer 4 in the transistor forming area 6 and the capacitor forming area 5.

At P4 (FIG. 5), the silicon nitride film 44 and the pad oxide film 43 are removed by wet etching using thermal phosphoric acid (Hot-$H_2PO_4$) and hydrofluoric acid (HF) to expose the SOI layer 4.

A resist mask 41 having an opening or aperture that has exposed above the slanting faces 27 formed at corners 9 of the SOI layer 4 located below a forming area of a floating gate electrode 16 lying in the transistor forming area 6 and the capacitor forming area 5, and the device isolation layer 14 lying between these slanting faces 27, is formed by photolithography. With it as a mask, the device isolation layer 14 and the embedded oxide film 3 are etched by wet etching using hydrofluoric acid or the like to form a capacitor trench or groove 28 which has a bottom face within the embedded oxide film 3 and has exposed the slanting faces 27.

At this time, the length of the capacitor groove 28 in a gate length direction is formed longer than the gate length of the floating gate electrode 16 by anisotropy of wet etching. Further, a pyramidal tip or leading end formed by the slanting faces 27 and the corner 9 of the top of a mountain portion 8 is exposed in a state of being protruded within the capacitor groove 28.

At P5 (FIG. 5), the resist mask 41 formed at the process P4 is removed, and a resist mask 41 that has exposed the SOI layer 4 of the capacitor forming area 5 is formed. With it as a mask, a low-concentration N-type impurity is ion-implanted onto the SOI layer 4 to form a first N-type low-concentration diffusion layer 46a for forming an N− diffusion layer 25 of a capacitor electrode 23 in the SOI layer 4 of the capacitor forming area 5 (first low-concentration N-type ion-implanting process step).

At P6 (FIG. 6), the resist mask 41 formed at the process P5 is removed, and a silicon oxide film comprised of silicon oxide for forming a gate insulating film 15 by a thermal oxidation method is formed over the SOI layer 4 and device isolation layer 14 in the capacitor forming area 5 and the transistor forming area 6 and at the internal surface of the capacitor groove 28. A polysilicon film for forming the floating gate electrode 16 is deposited on the silicon oxide film by the CVD method.

A resist mask (not shown) that covers the forming area of the floating gate electrode 16, that is, a resist mask which divides the SOI layer 4 of the transistor forming area 6 into two and covers over the corner 9 (corner 9 indicated by the broken line, of the top of the mountain portion 8 shown in FIG. 1 in the present embodiment) of the top of the mountain portion 8 on the transistor forming area 6 side, of the SOI layer 4 of the capacitor forming area 5 is formed on the polysilicon film by photolithography. The polysilicon film and silicon oxide film exposed by anisotropic etching are etched to expose the SOI layer 4, whereby a linear floating gate electrode 16 opposite to the SOI layer 4 of the transistor forming area 6 via the gate insulating film 15 and opposite to the pyramidal tip of the corner 9 on the transistor forming area 6 side, of the SOI layer 4 of the capacitor forming area 5 through the gate insulating film 15 is formed. The resist mask 41 is removed.

Next, a low-concentration N-type impurity is ion-implanted onto the SOI layer 4 in the transistor forming area 6 and the capacitor forming area 5 with the formed floating gate electrode 16 as a mask to form a second N-type low-concentration diffusion layer (not shown because it is formed in the transistor forming area 6 provided toward the front of the sheet and its depth direction in FIG. 6) for forming LDD portions 20 of a source layer 18 and a drain layer 19 at the SOI layer 4 lying on both sides of the floating gate electrode 16 (second low-concentration N-type ion-implanting process step).

At P7 (FIG. 6), a silicon oxide film is formed on the floating gate electrode 16 and the SOI layer 4, for example by the CVD method after the formation of the second N-type low-concentration diffusion layer. The entire surface lying above the SOI layer 4 is etched by anisotropic etching to expose the upper surface of the floating gate electrode 16 and the upper surface of the SOI layer 4, after which sidewalls 17 are formed on their corresponding side faces of the floating gate electrode 16.

A high-concentration N-type impurity is ion-implanted onto the SOI layer 4 of the capacitor forming area 7 and the SOI layer 4 of the transistor forming area 6 by photolithography to form the source layer 18 and the drain layer 19 in the SOI layer 4 lying on both sides of the floating gate electrode 16 of the transistor forming area 6 and form an N+ diffusion layer 24 of the capacitor electrode 23 in an area uncovered with the flowing gate electrode 16 and the sidewalls 17 at the SOI layer 4 of the capacitor forming area 5.

Thus, an nMOS element 11 is formed in which the LDD portions 20 of the source layer 18 and drain layer 19 are formed below the sidewalls 17 located on the floating gate electrode 16 side, and a channel region 21 is formed below the floating gate electrode 16 disposed between the LDD portions 20. Further, a MOS capacitor 12 is formed in which the N− diffusion layer 25 with the N-type impurity diffused therein in the low concentration is formed below the floating gate electrode 16 and the sidewall 17 for the capacitor electrode 23.

At P8 (FIG. 6), a thick silicon oxide film is deposited on the SOI layer 4 containing over the nMOS element 11, MOS capacitor 12 and device isolation layer 14 formed in this way, by the CVD method. The upper surface of the silicon oxide film is planarized or flattened to form an interlayer insulating film 29. Thereafter, a resist mask (not shown) having exposed the interlayer insulating film 29 lying in forming areas of contact holes 31 located above the source layer 18 and drain layer 19 of the n MOS element 11 and the N+ diffusion layer 24 of the capacitor electrode 23 for the MOS capacitor 12 is formed on the interlayer insulating film 29 by photolithography. With it as a mask, the contact holes 31 which extend through the interlayer insulating film 29 and thereby reach the source layer 18, drain layer 19 and capacitor electrode 23, are formed by etching.

The resist mask 41 is removed and a conductive material is embedded into the contact holes 31 by a sputtering method or the like to form contact plugs 30a, 30b and 30c. Their upper surfaces are subjected to a planarization process to expose the upper surface of the interlayer insulating film 29.

Thereafter, a wiring layer comprised of a wiring material is formed on the interlayer insulating film 29 by the sputtering method or the like. The wiring layer is patterned by photolithography and etching to form a source line (SL) connected to the corresponding source layer 18 of the nMOS element 11 via the contact plug 30a, a bit line (BL) connected to the corresponding drain layer 19 via the contact plug 30b, and a word line (WL) connected to the corresponding capacitor electrode 23 of the MOS capacitor 12 via the contact plug 30c, whereby a semiconductor memory device having the memory element 13 of the present embodiment shown in FIGS. 1 through 3 is formed.

When data stored in the memory element 13 formed in this way is erased, the bit line (BL) connected to the drain layer 19 of the nMOS element 11 for forming the memory element 13 is brought to an open state (indicative of a state being nowhere to be electrically connected or a high impedance state), the word line (WL) connected to the capacitor electrode 23 of the MOS capacitor 12 is grounded (GND; 0V), and a voltage ranging from 10V to 15V is applied to the source line (SL) connected to the source layer 18 of the nMOS element 11, as shown in FIG. 7.

Since, at this time, the drain layer 19 of the nMOS element 11 is held in the open state, only an electrostatic capacitance C2 on the source layer 18 side becomes effective as the electrostatic capacitance of the nMOS element 11. Since an electrostatic capacitance C1 of the MOS capacitor 12 and the electrostatic capacitance C2 of the nMOS element 11 are set so as to assume C1<C2, the voltage applied to the source layer 18 assumes a state of being applied approximately to the gate insulating film 15 of the MOS capacitor 12 by capacitive coupling.

Since, at this time, the pyramidal tip of the corner 9 lying below the floating gate electrode 16 on the nMOS element 11 side of the MOS capacitor 23 employed in the present embodiment is opposite to the floating gate electrode 16 via the gate insulating film 15 interposed therebetween, the concentration of an electric field occurs in that portion and thereby the electric field applied to the MOS capacitor 12 is enhanced, so that an FN (Fowler Nordheim) tunnel current (called FN current) flows from the capacitor electrode 23 to the floating gate electrode 16 being held in a floating state, whereby electrons are easily injected into the floating gate electrode 16.

Thus, the electric charges (electrons in the present embodiment) are stored in the flowing gate electrode 16 in a short period of time. The threshold voltage of the nMOS element 11 rises and the threshold voltage of the memory element 13 is brought to a high state, i.e., an erase state.

This state indicates a state in which "1" has been written into the memory element 13 as data. The erase state of the present embodiment corresponds to a state in which data "1" has been written into all memory elements 13.

In this case, even though each slanting face 27 is formed in the source layer 18 of the nMOS element 11, the leading end or tip thereof is not opposite to the floating gate electrode 16 via the gate insulating film 15. Therefore, no concentration of electric field occurs and no FN current flows through the gate insulating film 15 of the nMOS element 11.

This shows that even in the case in which the capacitive coupling (C1<C2) between the electrostatic capacitance C1 of the MOS capacitor 12 and the electrostatic capacitance C2 on the source layer 18 side cannot be enlarged, the electrons can be injected into the floating gate electrode. The degree of freedom of the electrostatic capacitances C1 and C2 of the memory element 13 is enlarged, thereby making it possible to bring the operation of the memory element 13 to a more suitable one.

This also shows that even though the voltage applied to the source layer 18 is set low, the injection of electrons into the floating gate electrode 16 at the erase operation is enabled. The voltage at erasure is set low to make it possible to suppress the generation of heat by the memory element 13.

Since the slanting faces 27 are formed using the birds beak formed when the device isolation layer 14 is formed by the LOCOS method in the present embodiment, the slanting faces 27 can easily be formed around the capacitor electrode 23 without adding a special process step.

If the memory element 13 of the present embodiment is used as described above, then an electrically reprogrammable non-volatile memory can be formed in the semiconductor substrate 1 of SOI structure, thereby making it possible to miniaturize and thin the semiconductor memory device.

In the present embodiment as mentioned above, an nMOS element and a polygonal MOS capacitor insulated and separated from each other by a device isolation layer are formed on an SOI layer of a semiconductor substrate of SOI structure. Slanting faces enlarged toward an embedded oxide film are provided around a capacitor electrode of the MOS capacitor. A floating gate electrode is provided which extends from over a channel region of a MOSFET to over the corner of an end portion on the nMOS element side, of the capacitor electrode and which is opposite to the channel region and the capacitor electrode with a gate insulating film interposed therebetween. Thus, upon an erase operation of a memory element that injects electric charges into the floating gate electrode, the injection of electrons into the floating gate electrode can easily be done using the concentration of an electric field by a pyramidal tip or leading end formed at the corner below the floating gate electrode, of the capacitor electrode, regardless of a source-to-drain breakdown voltage. Even in a semiconductor memory device of SOI structure low in the source-to-drain breakdown voltage, the electric charges can be injected into the corresponding floating gate electrode in a short period of time, and an electrically reprogrammable non-volatile memory excellent in reliability can be formed.

Since the device isolation layer is formed by the LOCOS method, the slanting faces can easily be formed around the capacitor electrode using a birds beak formed when the device isolation layer is formed, without adding a special process.

Figure 8:
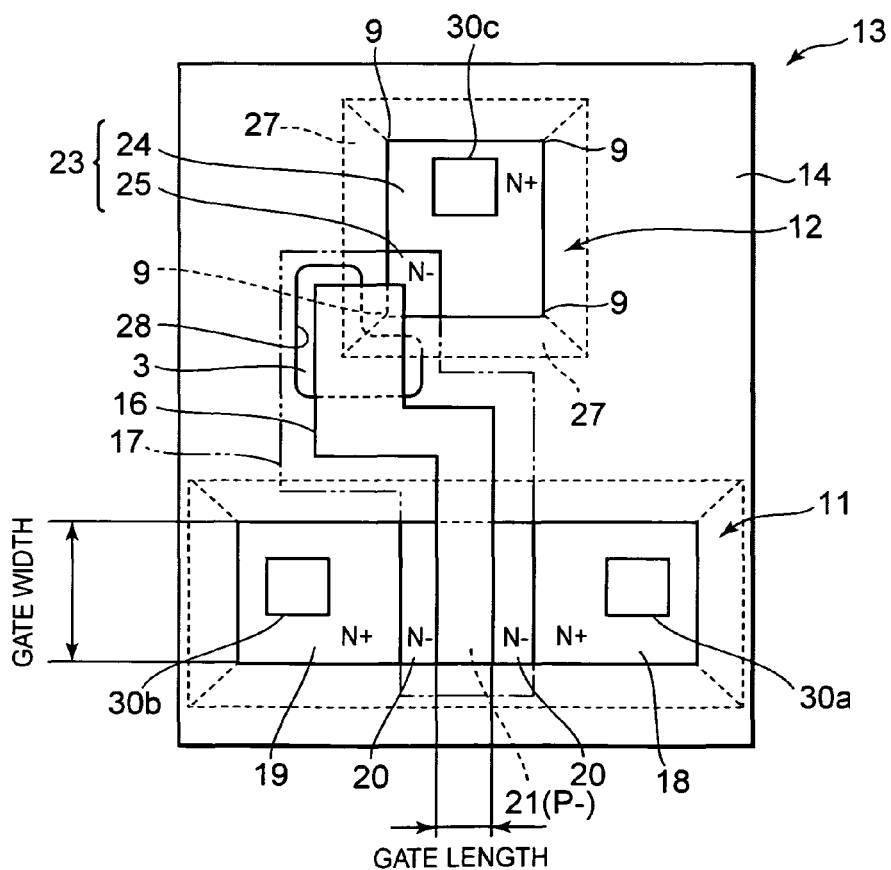
FIG. 8 is an explanatory diagram showing an upper surface of another form of the memory element according to the first embodiment.

Incidentally, although the present embodiment has described that the capacitor forming area 5 is set to the polygon constituted by the pentagon, as shown in FIG. 8, the capacitor forming area 5 is set to a polygon constituted by a rectangle having four corners 9, whose one side is parallel to a rectangular transistor forming area 6, and a floating gate electrode 16 shaped in a crank fashion may be extended on one corner 9 (corner 9 indicated by a left broken line in FIG. 8 in the present embodiment) lying on the nMOS element 11 side thereof.

Even though done in this way, a pyramidal tip or leading end is formed by slanting faces 27 formed on both side faces of one corner 9, and the injection of electrons into the corresponding floating gate electrode can easily be performed using the concentration of an electric field by the pyramidal tip formed at the corner below the floating gate electrode, of a capacitor electrode in a manner similar to the above.

In this case, the capacitor groove 28 at the process P4 (FIG. 5) is formed in the following manner. The resist mask 41 for the capacitor groove 28 is set as a resist mask 41 having an opening that has exposed over the slanting faces 27 formed at one corner 9 of an SOI layer 4 lying below a forming area of the floating gate electrode 16 in its corresponding capacitor forming area 5 and that has exposed a device isolation layer 14 lying in an area adjacent to these slanting faces 27. With it as a mask, the device isolation layer 14 and its corresponding embedded oxide film 3 are etched by wet etching to form the corresponding capacitor groove 28.

The floating gate electrode 16 at the process P6 (FIG. 6) is formed in the following manner. The resist mask 41 which covers the forming area of the floating gate electrode 16, is set as a resist mask 41 which divides the SOI layer 4 of the transistor forming area 6 into two and covers over one corner 9 (corner 9 indicated by the broken line in FIG. 8 in the present description) on the transistor forming area 6 side, of the SOI layer 4 of the capacitor forming area 5. With it as a mask, a polysilicon film and a silicon oxide film exposed by anisotropic etching are etched to expose the SOI layer 4, whereby the corresponding floating gate electrode 16 is formed.

Thus, the crank-shaped floating gate electrode 16 is formed which is opposite to the SOI layer 4 of the transistor forming area 6 via the corresponding gate insulating film 15 and opposite to the pyramidal tip of one corner 9 of the SOI layer 4 of the capacitor forming area 5 through the gate insulating film 15.

Second Preferred Embodiment

Figure 9:
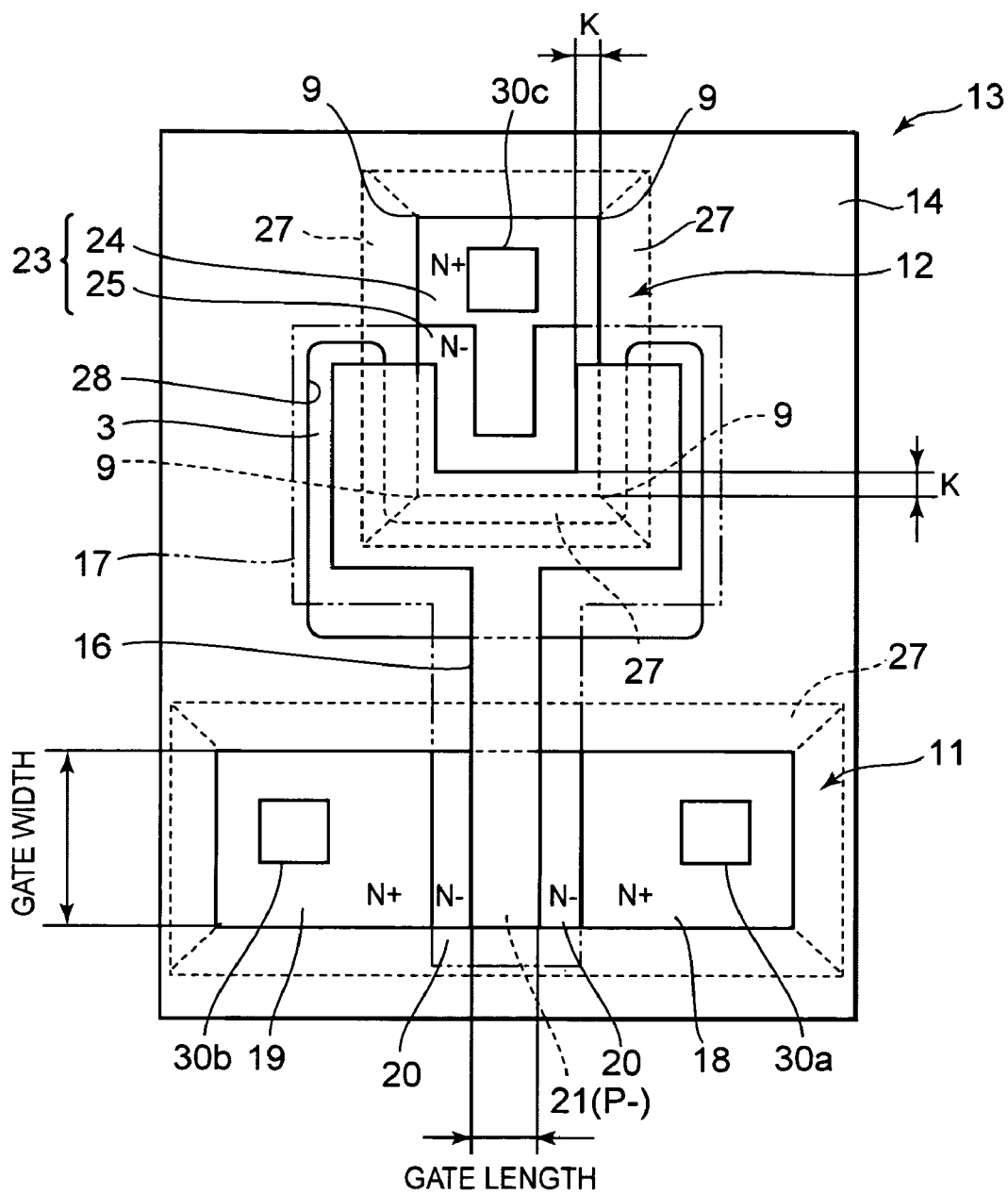
FIG. 9 is an explanatory diagram depicting an upper surface of a memory element according to a second embodiment.

FIG. 9 is an explanatory diagram showing an upper surface of a memory element or device according to a second embodiment.

Incidentally, the same reference numerals are attached to portions or elements similar to those of the first embodiment, and their explanations are therefore omitted.

In the memory element 13 according to the present embodiment, a capacitor forming area 5 is set to a polygon constituted by a rectangle having four corners 9, whose one side is parallel to a rectangular transistor forming area 6. A floating gate electrode 16 that extends in bent form is formed on both corners 9 on the nMOS element 11 side thereof.

A width K at which the floating gate electrode 16 in this case and a capacitor electrode 23 overlap each other is set in such a manner that the width K is made relatively narrow and the width K is expanded to increase the area of an overlapping region, thereby giving high priority to elongating of the length of a slanting face 27 that exists in the overlapping region.

This is because if done in this way, then the amount of injection of electrons can be further increased by elongating the length or size of an acute angle of a leading end or tip of each slanting face 27 high in electron injection efficiency.

A capacitor groove 28 employed in the present embodiment is formed in the following manner. At the process P4 (FIG. 5) of the first embodiment, the resist mask 41 thereat is set as a resist mask 41 having an opening that has exposed over the slanting faces 27 formed at both corners 9 of an SOI layer 4 lying below a forming area of the floating gate electrode 16 in its corresponding capacitor forming area 5 and that has exposed a device isolation layer 14 lying in an area adjacent to these slanting faces 27. With it as a mask, the device isolation layer 14 and its corresponding embedded oxide film 3 are etched by wet etching to form the corresponding capacitor groove 28.

The floating gate electrode 16 is formed in the following manner. At the process P6 (FIG. 6) of the first embodiment, the resist mask 41 which covers the forming area of the floating gate electrode 16, is set as a resist mask 41 which divides the SOI layer 4 of a transistor forming area 6 into two and covers over two corners 9 (two corners 9 indicated by broken lines in FIG. 9 in the present embodiment) on the transistor forming area 6 side, of the SOI layer 4 of a capacitor forming area 5. With it as a mask, a polysilicon film and a silicon oxide film exposed by anisotropic etching are etched to expose the SOI layer 4, whereby the corresponding floating gate electrode 16 is formed.

Thus, the bent floating gate electrode 16 is formed which is opposite to the SOI layer 4 of the transistor forming area 6 via the corresponding gate insulating film 15 and opposite to the two pyramidal tips of both corners 9 of the SOI layer 4 of the capacitor forming area 5 through the gate insulating film 15.

In the present embodiment as described above, a floating gate electrode is formed so as to extend on both corners on the nMOS element side, of a capacitor electrode in addition to an effect similar to the first embodiment. Thus, slanting faces of the capacitor electrode opposite to the floating gate electrode can be elongated in a state including two pyramidal tips of both corners of the capacitor electrode. Further, the amount of injection of electrons into the floating gate electrode at an erase operation can be increased using the concentration of an electric field by the two pyramidal tips formed at the corners on the floating gate electrode side, of the capacitor electrode, and a relatively long acute angle of each slanting face, and the injection of the electrons in the floating gate electrode can be performed in a shorter period of time.

Incidentally, although each of the embodiments has explained each of the transistors as the nMOS element, the embodiment is achieved in like manner even where the transistor is configured as a pMOS element and the type of impurity for both the capacitor electrode and high-concentration diffusion layer is made reverse.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor memory device having a memory element in which a MOSFET and a MOS capacitor both formed in a semiconductor substrate having a semiconductor layer stacked over a support substrate through an insulating film interposed therebetween, are connected by a floating gate electrode, comprising:

setting a transistor forming area, a polygonal capacitor forming area and a device isolation area surrounding peripheries of the transistor forming area and the capacitor forming area to the semiconductor layer;

forming a device isolation layer in the device isolation area between the transistor forming area and the capacitor forming area by a LOCOS method;

forming slanting faces around the semiconductor layer of the capacitor forming area, so that a width of the semiconductor layer of the capacitor forming area increases toward the insulating film;

forming a resist mask over the semiconductor layer and the device isolation layer, the resist mask having an opening that exposes over the slanting faces formed in the semiconductor layer of a forming area of the floating gate electrode and exposes the device isolation layer lying in an area adjacent to the slanting faces;

etching the device isolation layer and the insulating film using the resist mask as a mask to form a capacitor groove which has a bottom face within the insulating film and which exposes the slanting faces;

removing the resist mask and forming a gate insulating film over the semiconductor layer including the slanting faces and the device isolation layer, and on an inner face of the capacitor groove;

forming, over the gate insulating film, a floating gate electrode which divides the transistor forming area into two and extends over a corner of the capacitor forming area on a transistor forming area side; and ion-implanting an impurity of a same type as an impurity diffused into a source layer of the MOSFET into the semiconductor layer lying on both sides of the floating gate electrode of the transistor forming area and into the semiconductor layer of the capacitor forming area to form the source layer of the MOSFET, a drain layer thereof and a capacitor electrode of the MOS capacitor.

2. The method according to claim 1, wherein the capacitor forming area has a mountain portion which protrudes toward the transistor forming area, and wherein the floating gate electrode is formed so as to extend over a corner of a top of the mountain portion.

3. The method according to claim 1, wherein the capacitor forming area is set to a rectangular polygon, and wherein the floating gate electrode is formed so as to extend over one corner on the transistor forming area side, of the capacitor forming area.

4. The method according to claim 1, wherein the capacitor forming area is set to a rectangular polygon, and wherein the floating gate electrode is formed so as to extend over both corners on the transistor forming area side, of the capacitor forming area.

5. The method according to claim 1, wherein the capacitor groove is formed to undercut the slanting faces.

6. The method according to claim 1, wherein said forming slanting faces further includes forming slanting faces around the semiconductor layer of the transistor forming area, so that a width of the semiconductor layer of the transistor forming area increases toward the insulating film.

7. The method according to claim 6, wherein the capacitor groove is formed to undercut the slanting faces.

* * * * *